United States Patent
Fukuda et al.

(10) Patent No.: US 8,080,959 B2
(45) Date of Patent: Dec. 20, 2011

(54) MOTOR DRIVING CIRCUIT

(75) Inventors: Hirotoshi Fukuda, Yokohama (JP); Junichi Iida, Tokyo (JP)

(73) Assignee: Hitachi-LG Data Storage, Inc., Tokyo (JP)

( * ) Notice: Subject to any disclaimer, the term of this patent is extended or adjusted under 35 U.S.C. 154(b) by 358 days.

(21) Appl. No.: 12/419,537

(22) Filed: Apr. 7, 2009

(65) Prior Publication Data

US 2009/0251088 A1 Oct. 8, 2009

(30) Foreign Application Priority Data

Apr. 8, 2008 (JP) ................................. 2008-100801

(51) Int. Cl.
*H02P 6/00* (2006.01)
(52) U.S. Cl. ............ 318/400.29; 318/400.26; 388/907.2
(58) Field of Classification Search ............. 318/400.01, 318/400.26, 400.27, 400.29, 400.34, 459, 318/500; 388/907, 907.2, 928.1
See application file for complete search history.

(56) References Cited

U.S. PATENT DOCUMENTS

| | | | | |
|---|---|---|---|---|
| 5,859,519 A | * | 1/1999 | Archer | 318/801 |
| 6,056,380 A | * | 5/2000 | Nien | 312/348.1 |
| 6,683,437 B2 | * | 1/2004 | Tierling | 318/811 |
| 6,933,688 B2 | * | 8/2005 | Junnan et al. | 318/400.29 |
| 7,243,058 B1 | * | 7/2007 | Du et al. | 703/13 |
| 7,459,878 B2 | * | 12/2008 | Wang et al. | 318/798 |
| 2003/0020420 A1 | | 1/2003 | Naito et al. | |
| 2004/0178755 A1 | | 9/2004 | Usui et al. | |

FOREIGN PATENT DOCUMENTS

| | | |
|---|---|---|
| EP | 1 921 743 A1 | 5/2008 |
| JP | 08-084060 | 3/1996 |
| JP | 2003-199392 | 7/2003 |
| JP | 2004-282897 | 10/2004 |
| JP | 2006-262628 | 9/2006 |
| JP | 2007-097388 | 4/2007 |

* cited by examiner

*Primary Examiner* — Rina Duda

(74) *Attorney, Agent, or Firm* — Antonelli, Terry, Stout & Kraus, LLP.

(57) ABSTRACT

A motor driving circuit includes at least one set of switching elements, each set of switching elements being two switching elements connected in series to each other, and a diode connected in parallel with one of the two switching elements connected on a power source side, a terminal of a motor to be driven being connected to a junction point between the two switching elements. A voltage transfer element is provided for transferring, from the junction point between the two switching elements, a voltage of a counter electromotive force generated at the motor, to an input end of the other of the two switching elements connected on a ground side.

5 Claims, 5 Drawing Sheets

MOTOR DRIVING CIRCUIT

INCORPORATION BY REFERENCE

The present application claims priority from Japanese application JP2008-100801 filed on Apr. 8, 2008, the content of which is hereby incorporated by reference into this application.

BACKGROUND OF THE INVENTION

The present invention relates to motor driving circuits, which are suitable for use in optical disk apparatus, for example.

Conventionally, use has been widely made of a H-bridge circuit to constitute a circuit for driving a loading motor which serves to open/close a tray of an optical disk apparatus.

As is known, an optical apparatus has a tray for carrying thereon an optical disk, which is designed to be capable of closing by hand power of an operator even when the whole of the apparatus is in an off-state. A loading motor for opening/closing the tray is then actuated to perform a rotation operation for the opening/closure of the tray. At this time, the loading motor is to act as a generator to generate a counter electromotive force across the terminals of the motor. If this electromotive force is too large, it will lead to a problem such that the peripheral circuits may suffer malfunctions or failures.

To cope with such a problem, JP-A-2003-199392 discloses measures in which an overvoltage detecting circuit is provided for detecting that an H-bridge circuit constituting a loading motor driving circuit has at its output end a voltage higher than a power source voltage by a predetermined value or a voltage lower than a ground voltage by a predetermined value, so that an output transistor arranged on the ground side and connected to an output end of the H-bridge circuit at a voltage higher than the power source voltage by a predetermined value or an output transistor arranged on the power source side and connected to an output end of the H-bridge circuit at a voltage lower than the ground voltage by a predetermined value is turned on by an output of the overvoltage detecting circuit.

SUMMARY OF THE INVENTION

However, with the above-mentioned measures, it is necessary to provide such an overvoltage detecting circuit separately from an H-bridge circuit and the overvoltage detecting circuit may have a complicated structure, with a result that the overall structure of the motor driving circuit may be complex and large-sized.

The present invention has been made in view of the above points and is intended to provide a motor driving circuit of a simplified structure which is free of malfunctions and failures stemming from a counter electromotive force generated at a motor.

According to one aspect of the present invention, a motor driving circuit includes at least one set of switching elements, each set of switching elements being two switching elements connected in series to each other, and a diode connected in parallel with one of the two switching elements connected on a power source side, a terminal of a motor to be driven being connected to a junction point between the two switching elements, in which a voltage transfer element is provided for transferring, from a junction point between the two switching elements, a voltage of a counter electromotive force generated at the motor, to an input end of another one of the two switching elements connected on a ground side, the another switching element being turned on by a voltage caused by that the counter electromotive force generated at the motor is transferred thereto through the voltage transfer element.

In accordance with one or more of the embodiments of the present invention, it is possible to prevent a counter electromotive force generated at the motor from exerting ill effects on other circuits which are connected through diodes with the power source. As a result, a motor driving circuit of a simplified structure is realized which is free of malfunctions and failures stemming from a counter electromotive force generated at a motor.

Other objects, features and advantages of the invention will become apparent from the following description of the embodiments of the invention taken in conjunction with the accompanying drawings.

DESCRIPTION OF THE EMBODIMENTS

Embodiment of the present invention will now be described with reference to the accompanying drawings.

(1) First Embodiment

Figure 1:
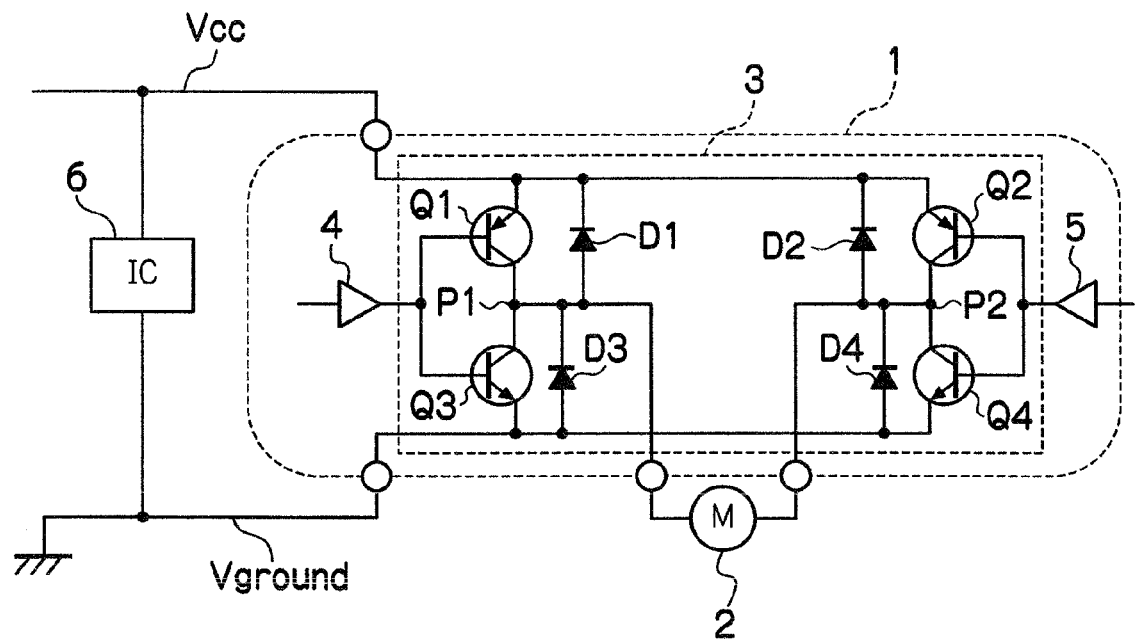
FIG. 1 is a circuit diagram showing an example of a structure of the conventional motor driving circuit.

In FIG. 1, numeral 1 generally represents a motor driving circuit for a loading motor 2 used in the conventional optical disk apparatus. In this embodiment, it is assumed that the loading motor 2 is a DC (Direct Current) motor.

The motor driving circuit 1 includes a so-called H-bridge circuit 3 having a first upper transistor Q1 and a first lower transistor Q3 connected in series to each other and a second upper transistor Q2 and a second lower transistor Q 4 connected in series to each other. In this embodiment, the first and second upper transistors are of pnp type, while the first and second lower transistors are of npn type.

The first upper transistor Q1 has its emitter connected to a power source line Vcc, its collector connected to the collector of the first lower transistor Q3 and its base connected to an output end of a first output stage driving amplifier 4, respectively. The first lower transistor Q3 has its emitter connected to a ground line $V_{ground}$ and its base connected to the output end of the first output stage driving amplifier 4.

Similarly, the second upper transistor Q2 has its emitter connected to the power source line Vcc, its collector connected to the collector of the second lower transistor Q4 and its base connected to an output end of a second output stage driving amplifier 5, respectively. The second lower transistor Q4 has its emitter connected to the ground line $V_{ground}$ and its base connected to the output end of the second output stage driving amplifier 5.

First to fourth protective diodes D1, D2, D3 and D4 are connected in parallel with the transistors Q1, Q2, Q3 and Q4, respectively. Each of the protective diodes has a polarity such that its forward bias direction is opposite to the direction in which its associated transistor conducts current.

The H-bridge circuit 3 has an output end formed by a junction point P1 between the collectors of the first upper transistor Q1 and the first lower transistor Q3 and another output end formed by a junction point P2 between the collectors of the second upper transistor Q2 and the second lower transistor Q4. The loading motor 2 to be driven is connected between the two output ends of the H-bridge circuit 3.

With the motor driving circuit in this arrangement, by applying driving voltages, being in opposite phases to each other, to the first and second output stage driving amplifiers 4 and 5, the loading motor 2 is driven for rotation in a forward or backward direction, as required.

Figure 2:
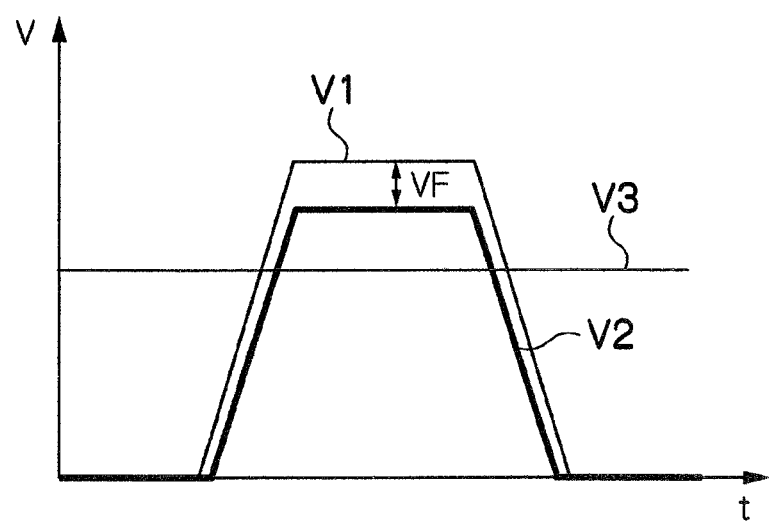
FIG. 2 is a waveform diagram useful for explaining a voltage applied to a signal processing IC when the conventional motor driving circuit is employed.

In the conventional motor driving circuit 1 as described above, when a tray of an optical disk apparatus is closed by hand power so that the loading motor 2 is driven for rotation, the motor 2 will act as a generator to generate, across its terminals, a voltage V1 of a counter electromotive force, as shown in FIG. 2.

Figure 3:
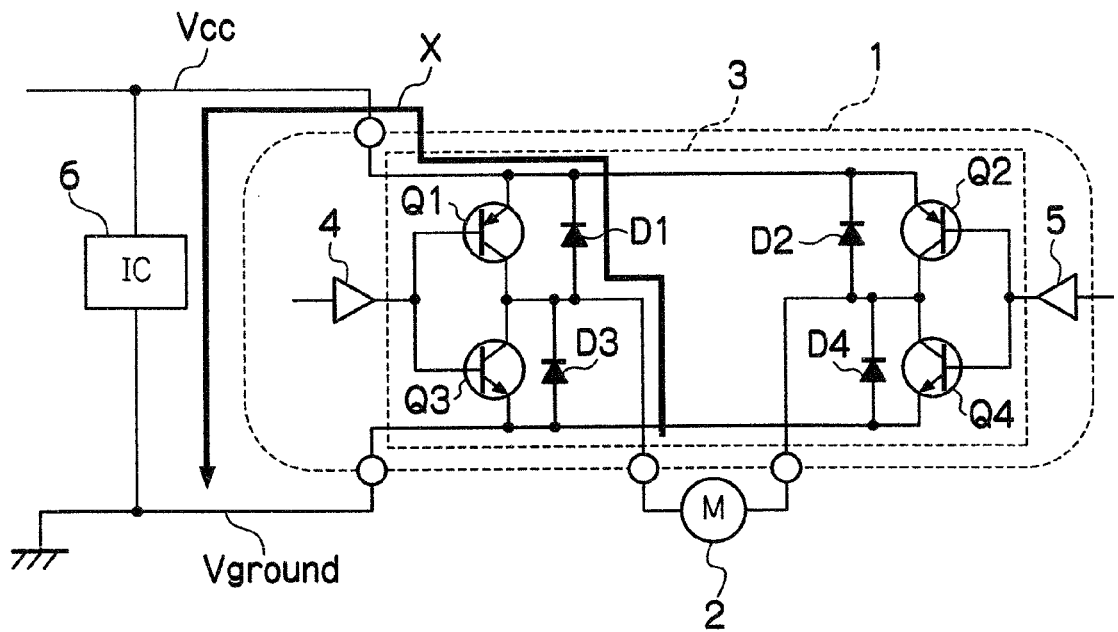
FIG. 3 is a conceptual diagram useful for explaining a voltage applied to a signal processing IC when the conventional motor driving circuit is employed.

The voltage V1 of the counter electromotive force thus generated, having been lowered to V2 by a fixed voltage drop VF by the first protective diode D1 connected between the emitter and collector of the first upper transistor Q1, is applied to the signal processing IC (Integrated Circuit) 6 connected between the power source line Vcc and the ground line $V_{ground}$, as shown in FIGS. 2 and 3. In FIG. 3, arrow "X" represents a path in which current caused by the electromotive force generated at the loading motor 2 flows. Therefore, if the voltage V2 caused by the counter electromotive force and applied to the signal processing IC 6 exceeds a rated maximum power source voltage V3, problems may arise in which the signal processing IC 6 will be subjected to malfunctions or breakdown.

Figure 4:
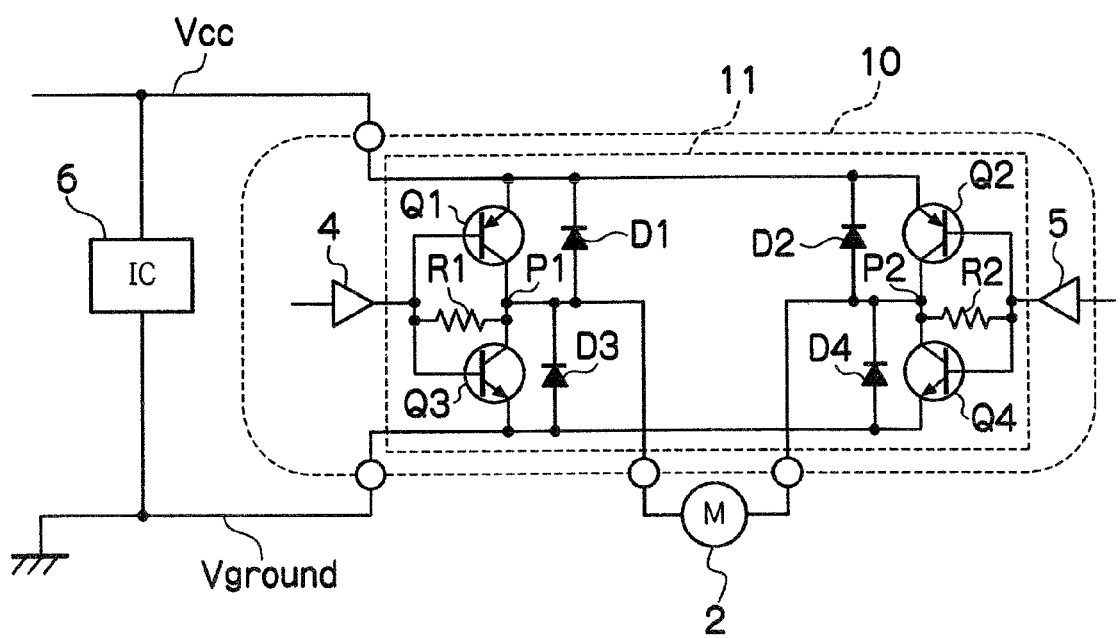
FIG. 4 is a circuit diagram showing an example of a structure of a motor driving circuit according to a first embodiment of the present invention.

To cope with this problem, in the motor driving circuit 10 according to this embodiment shown in FIG. 4 in which same reference numerals represent similar members in FIG. 1, first and second resistors R1 and R2 are additionally provided as compared to the motor driving circuit 1 shown in FIG. 1. Namely, one output end of the H-bridge circuit 11 and an input end of the first lower transistor Q3 are interconnected through the first resistor R1, while the other output end of the H-bridge circuit 11 and an input end of the second lower transistor Q4 are interconnected through the second resistor R2.

More particularly, in the motor driving circuit 10 according to this embodiment, the first resistor R1 having a predetermined resistance is connected between a junction point P1 between the collectors of the first upper transistor Q1 and the first lower transistor Q3 and the base of the first lower transistor Q3. Meanwhile, the second resistor R2 having a resistance equal to that of the first resistor R1 is connected between a junction point P2 between the collectors of the second upper transistor Q2 and the second lower transistor Q4 and the base of the second lower transistor Q4.

Thus, in the motor driving circuit 10 according to this embodiment incorporated into an apparatus (hereafter, the apparatus being assumed to be an optical disk apparatus), when the loading motor 2 is driven for rotation by hand power in a state in which the power source for the apparatus is turned off, a voltage of a counter electromotive force generated across the terminals of the loading motor is applied to the bases of the first and second lower transistors Q3 and Q4 through the first and second resistors R1 and R2, respectively.

As the power source for the optical disk apparatus is turned off, the first and second output stage driving amplifiers 4 and 5 exhibit high impedances, which allows the voltage of the above-mentioned counter electromotive force to be applied to the bases of the first and second lower transistors Q3 and Q4. Thus, the first and second lower transistors Q3 and Q4 are brought into a conductive state with a result that the terminals of the loading motor 2 are connected to the ground line $V_{ground}$ though low impedances.

Figure 5:
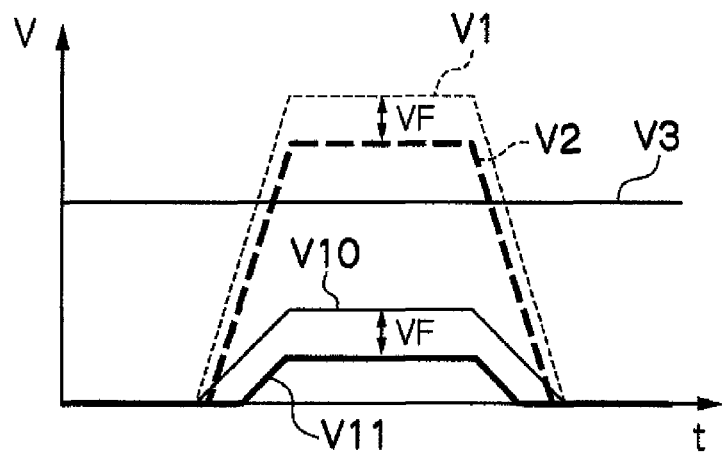
FIG. 5 is a waveform diagram useful for explaining a voltage applied to a signal processing IC when the motor driving circuit according to the first embodiment of the present invention is employed.
Figure 6:
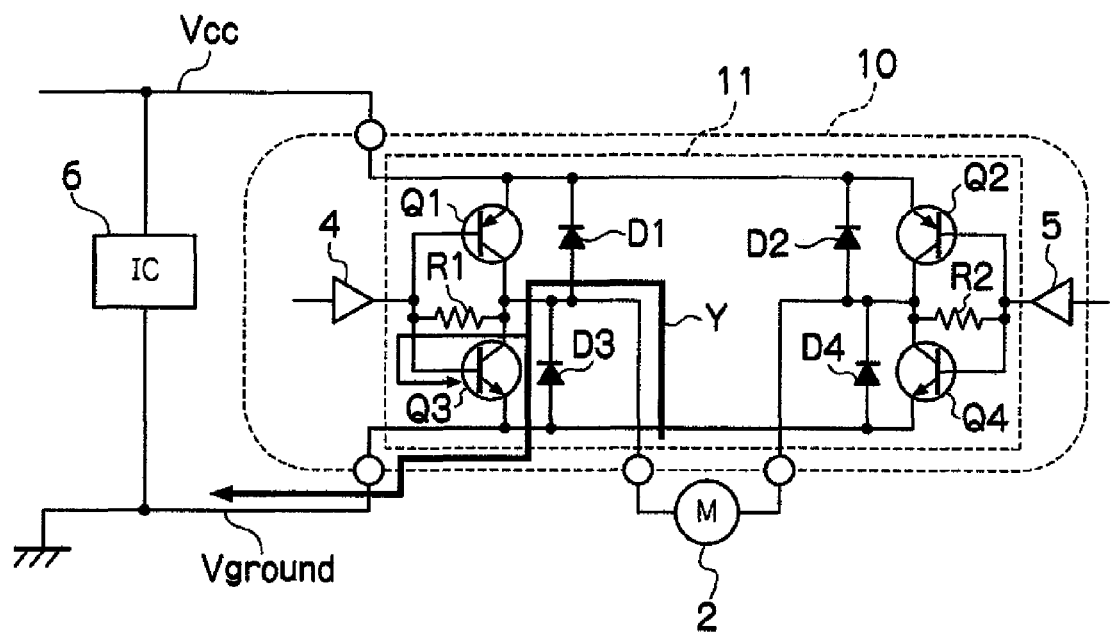
FIG. 6 is a conceptual diagram useful for explaining a voltage applied to a signal processing IC when the motor driving circuit according to the first embodiment of the present invention is employed.

Consequently, as shown in FIGS. 5 and 6, the voltage V10 of the counter electromotive force of the loading motor 2 now has a value lowered, and this voltage V10 is further subjected to a fixed voltage drop of VF at the first protective diode D1 connected between the emitter and the collector of the first upper transistor Q1 to be lowered to V11, which is then applied to the signal processing circuit IC 6. In FIG. 6, arrow "Y" represents a path in which current caused by the electromotive force generated at the loading motor 2 flows.

As shown in FIG. 5, since the voltage V11 caused by the above-mentioned electromotive force and applied to the signal processing IC 6 is lower than the rated maximum power source voltage V3 for the signal processing IC 6, it is possible to effectively avoid malfunctions of and failures in the signal processing IC 6 due to the counter electromotive force of the loading motor 2.

It should be noted that the first and second resistors R1 and R2 have resistances such that the first and second output stage driving amplifiers 4 and 5 can well drive the resistors R1 and R2. By this, in the normal operation, the base voltages of the first and second lower transistors Q3 and Q4 are solely determined by the driving voltages from their associated first and second output stage driving amplifier 4 and 5, so that the first and second resistors R1 and R2 exert no influence on the operation of the H-bridge circuit 11.

As described above, with the motor driving circuit 10 according to this embodiment, when the loading motor 2 is driven for rotation by hand power to generate a counter electromotive force across its terminals, the voltage V11 caused by the counter electromotive force and applied to the signal processing IC 6 can be made lower than the rated maximum power source voltage V3 for the signal processing IC 6. Accordingly, it is possible to effectively avoid malfunctions of and failures in the signal processing IC 6 due to the counter electromotive force of the loading motor 2.

(2) Second Embodiment

Figure 7:
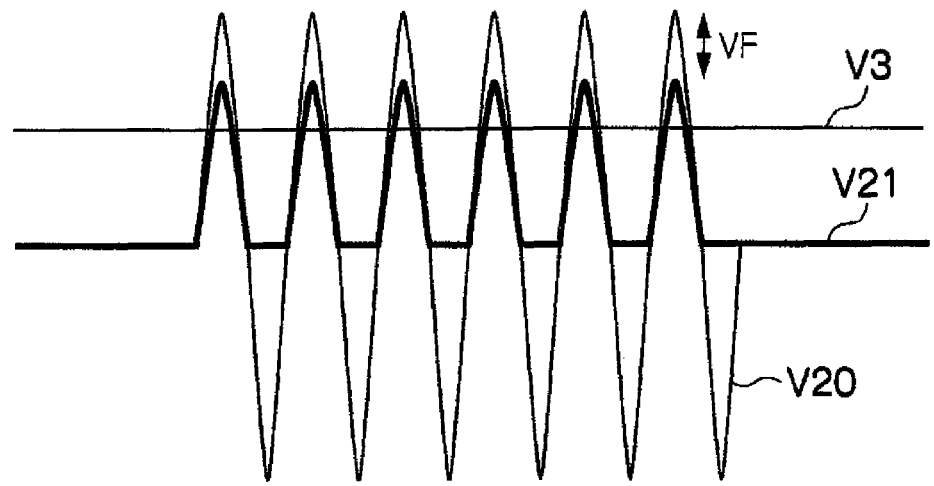
FIG. 7 is a waveform diagram useful for explaining a voltage applied to a signal processing IC when the conventional motor driving circuit is employed, in which the loading motor is an AC motor.

Assuming now that the loading motor 2 in the motor driving circuit 1 shown in FIG. 1 is an AC (Alternating Current) motor, and when the motor 2 is driven for rotation by hand power in a state in which the power source for the optical disk apparatus is turned off, a voltage V20 of a counter electromotive force generated across the terminals of the motor 2 is in an AC waveform, as shown in FIG. 7.

The voltage V20, having been lowered to V21 by a fixed voltage drop VF by the first protective diode D1 connected between the emitter and collector of the first upper transistor Q1 as shown in FIG. 7, is applied to the signal processing IC 6. Therefore, if the maximum value of the voltage V21 to be applied to the signal processing IC 6 exceeds the rated maximum power source voltage for the signal processing IC 6, this may cause problems in which the signal processing IC 6 may suffer malfunctions or failures, as in the case in which the loading motor 2 is a DC motor.

Figure 8:
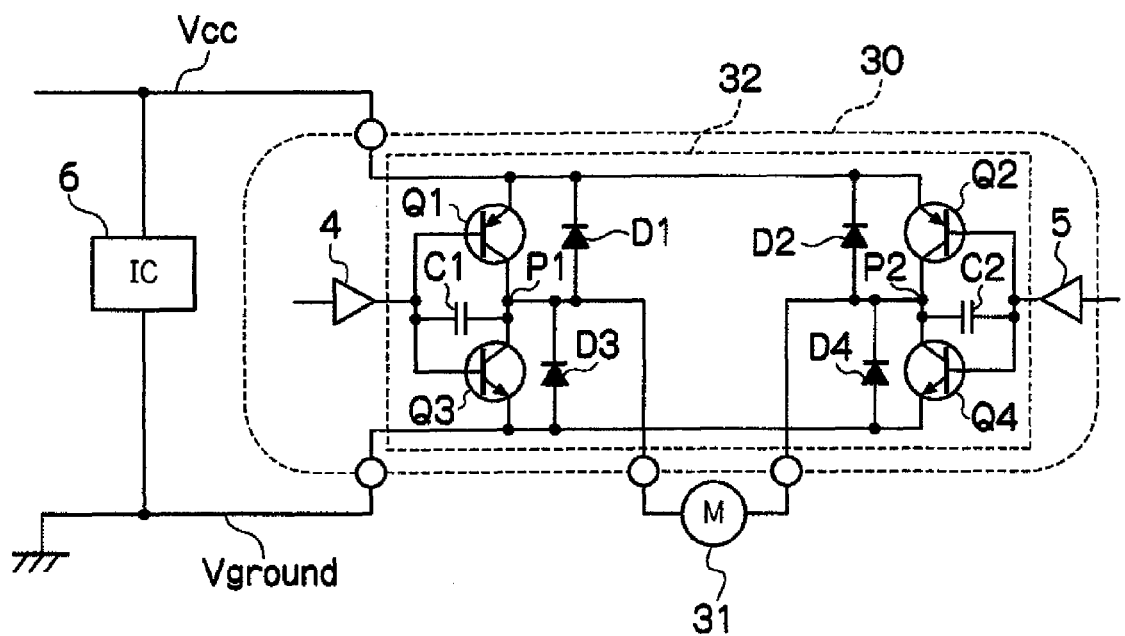
FIG. 8 is a circuit diagram showing an example of a structure of a motor driving circuit according to a second embodiment of the present invention.

In the motor driving circuit 30 according to this embodiment shown in FIG. 8 in which same reference numerals represent similar members in FIG. 1, it is assumed that a loading motor 31 is an AC motor. First and second capacitors C1 and C2 are additionally provided as compared to the motor driving circuit 1 shown in FIG. 1. Namely, one output end of the H-bridge circuit 32 and the input end of the first lower transistor Q3 are interconnected through the first capacitor C1, while the other output end of the H-bridge circuit 32 and the input end of the second lower transistor Q4 are interconnected through the second capacitor C2.

More particularly, in the motor driving circuit 30 according to this embodiment, the first capacitor C1 having a predetermined capacitance is connected between a junction point P1 between the collectors of the first upper transistor Q1 and the first lower transistor Q3 and the base of the first lower transistor Q3. Meanwhile, the second capacitor C2 having a capacitance equal to that of the first capacitor C1 is connected between a junction point P2 between the collectors of the second upper transistor Q2 and the second lower transistor Q4 and the base of the second lower transistor Q4.

Figure 9:
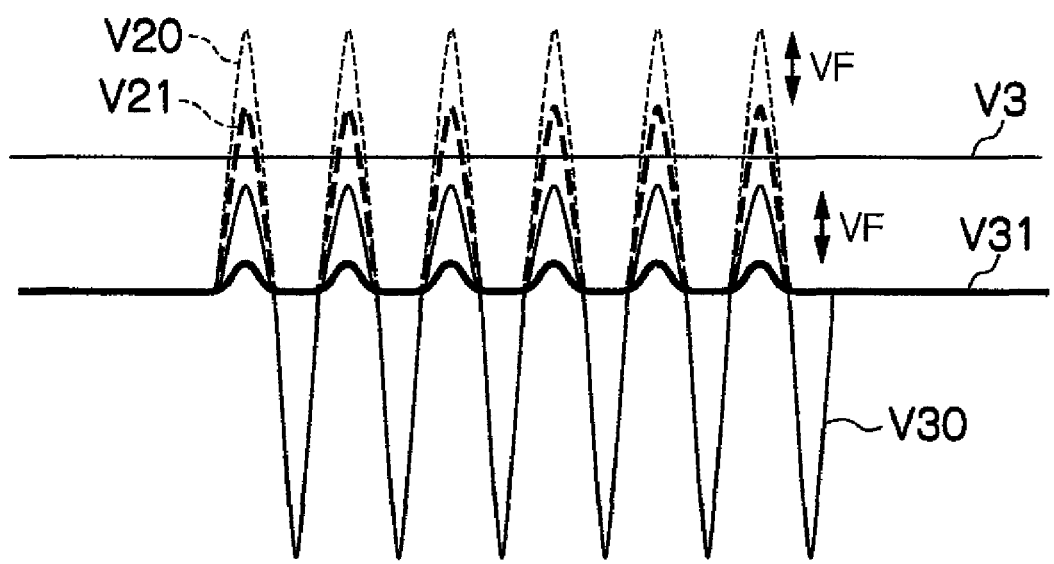
FIG. 9 is a waveform diagram useful for explaining a voltage applied to a signal processing IC when the motor driving circuit according to the second embodiment of the present invention is employed.

Thus, in the motor driving circuit 30 according to this embodiment, when the loading motor 31 is driven for rotation by hand power in a state in which the power source for an optical disk apparatus is turned off, the voltage V30 as shown in FIG. 9 of the counter electromotive force generated across the terminals of the loading motor 31 is applied to the bases of the first and second lower transistors Q3 and Q4 through the first and second capacitors C1 and C2, respectively.

Consequently, the voltage V30 of the counter electromotive force of the loading motor 31 now a value lowered, and this voltage V30 is further subjected to a fixed voltage drop of VF at the first protective diode D1 connected between the emitter and the collector of the first upper transistor Q1 to be lowered to a voltage V31, which is then applied to the signal processing circuit IC 6.

As can be seen from FIG. 9, since the voltage V31 caused by the above-mentioned electromotive force and applied to the signal processing IC 6 is lower than the rated maximum power source voltage V3 for the signal processing IC 6, it is possible to effectively avoid malfunctions of and failures in the signal processing IC 6 due to the counter electromotive force of the loading motor 31.

As described above, with the motor driving circuit 30 according to this embodiment, when the loading motor 31 is driven for rotation by hand power to generate a counter electromotive force across its terminals, the maximum value of the voltage V31 caused by the counter electromotive force and applied to the signal processing IC 6 can be made lower than the rated maximum power source voltage V3 for the signal processing IC 6. Accordingly, it is possible to effectively avoid malfunctions of and failures in the signal processing IC 6 due to the counter electromotive force of the loading motor 31.

(3) Other Embodiments

In the above-described embodiments, the present invention is applied to motor driving circuits for driving a loading motor for a tray opening/closure mechanism in an optical disk apparatus, but embodiments of the present invention need not be limited thereto and widely involve other various kinds of motor driving circuits.

In the first embodiment, use is made of first and second resistors R1 and R2 as voltage transfer elements for transferring voltages of the counter electromotive force generated at the loading motor 2 from the junction point P1 between the first upper transistor Q1 and the first lower transistor Q3 and from the junction point P2 between the second upper transistor Q2 and second lower transistor Q4 to the input ends of their associated first and second lower transistors Q3 and Q4, respectively. Meanwhile, in the second embodiment, use is made of first and second capacitors C1 and C2 as such voltage transfer elements. However, embodiments of the present invention need not be limited thereto and widely involve those in which other various kinds of circuit elements are used as the voltage transfer elements.

Further, in the above-described embodiments, the H-bridge circuit 11 or 32 includes switching elements constituted by transistors, but the switching elements may be any other kinds of elements such as FETs (Field-Effect Transistors), MOSs (Metal Oxide Semiconductors), relays, and the like.

Further, in the above-described embodiments, the motor driving circuit 10 or 30 includes the H-bridge circuit 11 or 32, but the motor driving circuit may include two switching elements connected in series, in place of the H-bridge circuit 11 or 32.

Further, in the above-described first embodiment, the motor is a DC motor. However, in that embodiment, the motor may be an AC motor with the voltage transfer elements similarly constituted by resistors as described.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A motor driving circuit comprising at least one set of switching elements, each set of switching elements being two switching elements connected in series to each other, and a diode connected in parallel with one of said two switching elements connected on a power source side, a terminal of a motor to be driven being connected to a junction point between said two switching elements, wherein:
    a voltage transfer element is provided for transferring, from a junction point between said two switching elements, a voltage of a counter electromotive force generated at the motor, to an input end of another one of said two switching elements connected on a ground side, said another switching element being turned on by a voltage caused by that said counter electromotive force generated at the motor is transferred thereto through said voltage transfer element.

2. A motor driving circuit according to claim 1, wherein the motor is a DC motor and said voltage transfer element is a resistor.

3. A motor driving circuit according to claim 1, wherein the motor is an AC motor and said voltage transfer element is a capacitor.

4. A motor driving circuit according to claim 1, wherein said two switching elements connected in series constitute, along with other two switching elements connected in series to each other, an H-bridge circuit.

5. A motor driving circuit according to claim 1, wherein the motor is an AC motor and said voltage transfer element is a resistor.

* * * * *